(12) United States Patent
Ishikawa et al.

(10) Patent No.: US 6,262,518 B1
(45) Date of Patent: Jul. 17, 2001

(54) HOUSING FOR PIEZOELECTRIC TRANSFORMER DEVICE

(75) Inventors: Katsuyuki Ishikawa; Takeshi Fujimura; Masaaki Toyama, all of Tokyo; Katsumi Uesawa, Yokohama, all of (JP)

(73) Assignee: Taiheiyo Cement Corporation, Tokyo (JP)

( * ) Notice: Subject to any disclaimer, the term of this patent is extended or adjusted under 35 U.S.C. 154(b) by 0 days.

(21) Appl. No.: 09/508,798

(22) PCT Filed: Jun. 29, 1998

(86) PCT No.: PCT/JP98/02906

§ 371 Date: Mar. 17, 2000

§ 102(e) Date: Mar. 17, 2000

(87) PCT Pub. No.: WO99/17384

PCT Pub. Date: Apr. 8, 1999

(30) Foreign Application Priority Data

Sep. 29, 1997  (JP) .................................................. 9-264616

(51) Int. Cl.$^7$ ................................................. H01L 41/08
(52) U.S. Cl. ........................................... 310/355; 310/348
(58) Field of Search .................................. 310/344, 348, 310/358, 359, 366, 354, 355, 356

(56) References Cited

U.S. PATENT DOCUMENTS

| 3,662,194 | | 5/1972 | Morika et al. . |
| 3,790,826 | | 2/1974 | Kawada . |
| 5,747,916 | * | 5/1998 | Sugimoto et al. .................... 310/348 |
| 5,847,491 | * | 12/1998 | Taihaku et al. ................... 310/348 X |
| 5,998,909 | * | 12/1999 | Kumasaka et al. .................. 310/348 |
| 6,097,132 | * | 8/2000 | Inoi et al. ........................ 310/348 X |
| 6,172,447 | * | 1/2001 | Ishikawa et al. .................... 310/359 |

FOREIGN PATENT DOCUMENTS 09036453   2/1997   (JP) .

* cited by examiner

Primary Examiner—Mark O. Budd
(74) Attorney, Agent, or Firm—Burns, Doane, Swecker & Mathis, LLP

(57) ABSTRACT

Mount terminals (4a, 5a, 6) are formed on end faces of a housing (1). These mount terminals serve to mount the housing (1) on a circuit board and also serves as lead electrodes for the outer and output electrodes of a piezoelectric device to be housed in the case. The piezoelectric device is fixed in the housing (1) by using the lead electrodes (4, 5) integrally formed with mount terminals (4a, 5a) and projections (2, 3).

20 Claims, 13 Drawing Sheets

HOUSING FOR PIEZOELECTRIC TRANSFORMER DEVICE

TECHNICAL FIELD

The present invention relates to a housing for a piezoelectric transformer device, e.g., a housing for mounting a Rosen piezoelectric transformer on a circuit board.

BACKGROUND ART

Recently, liquid crystal display panels have been widely used as display units in notebook personal computers which are easy to carry. Such a liquid crystal display panel incorporates a cold-cathode fluorescent lamp serving as a backlight for backlighting the panel. In order to light this cold-cathode fluorescent lamp, a high voltage of about 1 kV or more is required. To maintain emission of light, a voltage of about several hundred volts must be applied.

In such notebook personal computers and similar products, owing to their characteristics, the demand for compact inverters for backlights is high. In order to meet this demand, piezoelectric transformers are used as inverter components.

As such a piezoelectric transformer, the piezoelectric transformer device (to be referred to as the piezoelectric device hereinafter) having the multilayer structure proposed in Japanese Patent Application No. 8-52553 filed by the present applicant will be briefly described below with reference to FIGS. 1 to 5.

FIG. 1 is a perspective view showing the piezoelectric device having the multilayer structure previously proposed by the present applicant. FIG. 2 is a front view of the piezoelectric device in FIG. 1. FIG. 3 is a plan view of the piezoelectric device in FIG. 1.

A piezoelectric device 106 has an outer shape like the one shown in FIGS. 1, 2, and 3. The right and left half regions of the device will be respectively referred to as the second and first regions hereinafter.

Outer electrodes 101 and 102 as primary (input) electrodes are formed on the upper surface of the first region. An outer electrode 103 as a secondary (output) electrode is formed on the right end portion of the second region. Lead wires 105 are connected to the outer electrodes 101, 102, and 103 with solder portions 104.

The internal structure of the first region will be described next. FIG. 4 is a sectional view taken along a line I—I of the piezoelectric device in FIG. 3. FIG. 5 is a sectional view taken along a line II—II of the piezoelectric device in FIG. 3.

As shown in FIGS. 4 and 5, in the first region, a plurality of inner electrodes 101a and 102a are alternately stacked, and the spaces between these inner electrodes are filled with the piezoelectric element 106. As shown in FIGS. 4 and 5, in the first region, the plurality of inner electrodes 101a are connected to each other through a columnar conductor (to be referred to as an interlevel connection conductor hereinafter) 108a, and the plurality of inner electrodes 102a are connected to each other through an interlevel connection conductor 108b. Circular holes (to be referred to as holes hereinafter) are formed in the inner electrodes 101a and 102a so that the inner electrodes 101a and 102a are not connected to each other through the interlevel connection conductors 108a and 108b.

The interlevel connection conductor 108a extends toward the upper surface of the first region and is connected to the outer electrode 101.

Similarly, the interlevel connection conductor 108b extends toward the upper surface of the first region and is connected to the outer electrode 102.

The piezoelectric device having the above multilayer structure is driven as follows. First, a high voltage is applied between the outer electrodes 101 and 102 to polarize the first region in the vertical direction (direction of thickness). A predetermined voltage is then applied between the outer electrode 101 or 102 and the outer electrode 103 to polarize the second region in the longitudinal direction. When an AC voltage is applied between the outer electrodes 101 and 102 of the device in the polarized state, the piezoelectric element 106 in the first region mechanically vibrates in accordance with the piezoelectric material constant unique to the piezoelectric element, the resonance characteristics, and the dimensions of the overall device. The vibrations are converted into a voltage by the piezoelectric element 106 in the second region. As a result, a boosted high AC voltage can be extracted from the outer electrode 103.

When such a piezoelectric transformer is to be mounted on a circuit board, the transformer is generally housed in an insulating container (to be referred to as a housing hereinafter), and the housing is mounted on the circuit board for the following reason. As described above, when the piezoelectric transformer operates, the piezoelectric device itself mechanically vibrates. If this vibration is inhibited when the device is mounted on the circuit board, the output characteristics of the piezoelectric transformer deteriorate. Therefore, when the piezoelectric transformer is to be mounted, the device must be supported at portions corresponding to nodes of the vibrations of the piezoelectric device to prevent the vibrations of the device from being suppressed. In addition, since the secondary output of the piezoelectric transformer is set at a high voltage, the entire piezoelectric transformer must be covered with an insulating cover for safety reasons, i.e., preventing contact between the secondary output and other components and preventing the operator from receiving an electric shock.

An example of how the above piezoelectric device is housed in a housing having a general structure will be described with reference to FIGS. 6 to 10.

FIG. 6 is a perspective view showing a state in which the piezoelectric device having the multilayer structure previously proposed by the present applicant is housed in a general housing. FIG. 7 is a plan view of the housing in FIG. 6.

As shown in FIGS. 6 and 7, a housing 107 is a box-like resin container having an upper opening. The housing 107 has a volume enough to prevent the piezoelectric device 106 and the solder portions 104 of the lead wires 105 from protruding from the upper opening of the housing 107 when the piezoelectric device 106 is housed in the housing 107. Projections 110 for fixing the piezoelectric device 106 in the housing 107 are formed on the inside of the housing 107 at positions corresponding to the nodes of the vibrations of the piezoelectric device 106. In the case shown in FIGS. 6 and 7, the respective lead wires 105 extend outside through the holes (the holes may be slits) formed in the end faces in advance.

A method of housing the piezoelectric transformer in the housing 107 in this housed state will be described below, together with the mounted state of the housing on a circuit board.

FIG. 8 is a sectional view taken along a line III—III of the housing in FIG. 6. FIG. 9 is a sectional view taken along a line IV—IV of the housing in FIG. 6. FIG. 10 is a perspective view showing an example of how the piezoelectric transformer is mounted on the circuit board.

When the piezoelectric device 106 is to be housed in the housing 107, the projections 110 are first coated with an adhesive 109. As shown in FIGS. 8 and 9, the piezoelectric device 106 is then housed in the housing 107 such that the nodes of the vibrations of the piezoelectric device 106 coincide with the projections 110. With this process, the piezoelectric can be supported in the housing 107 at the portions corresponding to the nodes of vibrations.

The housing is mounted on the circuit board as follows. After the adhesive 109 applied to the projections 110 is hardened, the housing 107 is turned upside down and mounted on a circuit board 112, as shown in FIG. 10. The housing 107 is fixed to the circuit board 112 with an adhesive 111. The respective lead wires 105 extending through the above holes are connected to the circuit board 112 by soldering.

Other methods of supporting the piezoelectric device and mounting it on the circuit board, other than those described above, have been proposed (Japanese Patent Laid-Open Nos. 8-32135 and 8-264853).

When the piezoelectric device is to be housed in the above general housing, a large number of steps are required, ranging from the step of housing the piezoelectric device in the housing to the step of connecting the lead wires on the circuit board, resulting in low productivity. When terminals to which the lead wires of the piezoelectric device are connected are to be formed on the housing, and the housing is to be mounted on the circuit board through the terminals, a large number of steps are required in mounting the housing, resulting in low productivity.

For example, Japanese Patent Laid-Open No. 8-298213 discloses a housing superior to the housing having the above structure in terms of productivity. According to this housing, connection of the piezoelectric device to the circuit board and supporting of the device in the housing are performed by using the same terminals, thereby obviating the necessity to use lead wires to connect the piezoelectric device to the circuit board. According to this technique, the piezoelectric device is supported in the housing by using only the elastic characteristics of the terminal members (material) formed on the housing. If, therefore, an external shock or vibration acts on this housing, the electric connection between the piezoelectric device and the terminals may be broken, resulting in instantaneously disconnection.

DISCLOSURE OF INVENTION

It is an object of the present invention to provide a housing that facilitates a housing process for a piezoelectric transformer device and can be easily mounted on a circuit board.

In order to achieve the above object, a housing for a piezoelectric transformer device according to the present invention has the following arrangement.

There is provided a piezoelectric transformer device housing made of a resin and adapted to house a piezoelectric transformer device having primary outer electrodes formed in one plane, wherein a bottom portion of the housing has an opening in which the piezoelectric transformer device is inserted, an upper portion of the housing has lead electrodes to apply voltage to the outer electrodes, the lead electrodes being formed by using elastic members that produce a restoring force when the outer electrodes are brought into contact with the lead electrodes, and portions of two inner side surfaces of the housing at positions corresponding to nodes of vibrations of the piezoelectric transformer device when the piezoelectric transformer device is housed have first projections having pawl-like portions on a bottom portion side of the housing, wherein the piezoelectric transformer device is supported in the housing by using the lead electrodes, the first projections, and the pawl-like portions of the first projections. This arrangement simplifies the steps of housing the piezoelectric transformer device on the primary side of the housing, and allows the housing to be easily mounted on a circuit board.

The primary side of the piezoelectric transformer device is preferably brought into contact with the pawl-like portions with the restoring force produced by the lead electrodes. This allows the primary side of the piezoelectric transformer device to be reliably fixed in the housing.

Preferably, for example, a portion of an inner upper surface of the housing at a position corresponding to a node of vibrations of the secondary side of the piezoelectric transformer device when the piezoelectric transformer device is housed further has a second projection, and the secondary side of the piezoelectric transformer device is supported in the housing by using the first projections, the pawl-like portions of the first projections, and the second projection. This facilitates the steps of housing the piezoelectric transformer device in the secondary side of the housing, and allows the housing to be easily mounted on the circuit board.

In addition, preferably, the second projection is integrally formed with the housing to produce a restoring force when the piezoelectric transformer device is brought into contact with the second projection, and the secondary side of the piezoelectric transfer device is brought into contact with the pawl-like portion by using the restoring force. This allows the secondary side of the piezoelectric transformer device to be reliably fixed in the housing.

Furthermore, in order to achieve the above object, a housing for a piezoelectric transformer device according to the present invention has the following arrangement.

There is provided a piezoelectric transformer device housing made of a resin and adapted to house a piezoelectric transformer device having primary outer electrodes formed in one plane, wherein a bottom portion of the housing has an opening in which the piezoelectric transformer device is inserted, an upper portion of the housing has lead electrodes to apply voltage to the outer electrodes, the lead electrodes being formed by using elastic members that produce a restoring force when the outer electrodes are brought into contact with the lead electrodes, and portions of two inner side surfaces of the housing at positions corresponding to nodes of vibrations of the piezoelectric transformer device when the piezoelectric transformer device is housed have projections formed in conformity with a shape of side surfaces of the piezoelectric transformer device in a widthwise direction, wherein the piezoelectric transformer device is supported in the housing by using the projections. This facilitates the steps of housing the piezoelectric transformer device in the housing, and allows the housing to be easily mounted on a circuit board.

Preferably, the housing is molded with a flexible resin, and the piezoelectric transformer device is clamped through the projections with restoring forces produced on the two side surfaces of the housing when the piezoelectric transformer device is housed in the housing.

In the housing having either of the above arrangements, preferably, the lead electrodes and mount terminals used to mount the housing on a circuit board are integrally formed, or the case further comprises a lead wire connected to a secondary outer electrode of the piezoelectric transformer device, and a mount terminal used to mount the housing on a circuit board, thereby easily mounting the housing on the circuit board.

Other features and advantages of the present invention will be apparent from the following description taken in conjunction with the accompanying drawings, in which like reference characters designate the same or similar parts throughout the figures thereof.

BEST MODE FOR CARRYING OUT THE INVENTION

Housings for piezoelectric transformer devices according to the embodiments of the present invention will be described in detail below with reference to the accompanying drawings.

In each embodiment to be described below, the piezoelectric device is driven in the λ mode. Obviously, however, the present invention is not limited to this. For example, the piezoelectric device may be driven in the λ/2 or 3/2λ mode.

In the following description, for the sake of descriptive convenience, the piezoelectric device having the structure shown in FIGS. 1 to 5 is housed in the housing of the present invention. Obviously, however, the piezoelectric device that can be housed in the housing is not limited to this. For example, a piezoelectric device having inner electrodes protruding from an end face in the longitudinal direction may be housed in the housing.

First Embodiment

The first embodiment of the present invention will be described below with reference to FIGS. 11 to 28. The outer shape of a housing according to the first embodiment will be described first.

Figure 1:
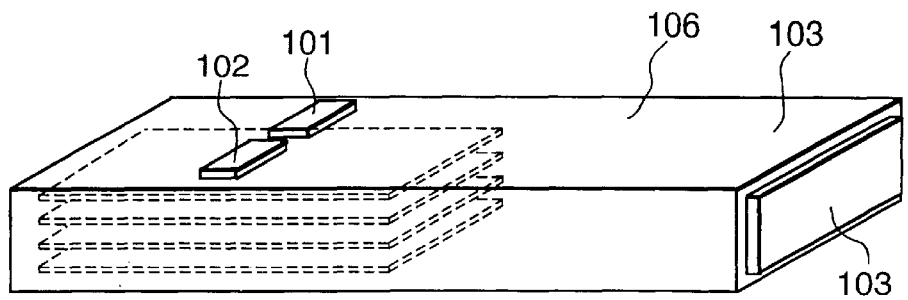
FIG. 1 is a perspective view showing the piezoelectric device having the multilayer structure previously proposed by the present applicant.
Figure 2:
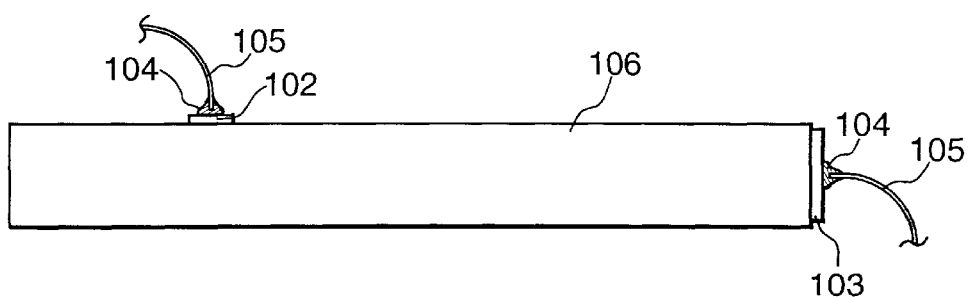
FIG. 2 is a front view of the piezoelectric device in FIG. 1.
Figure 3:
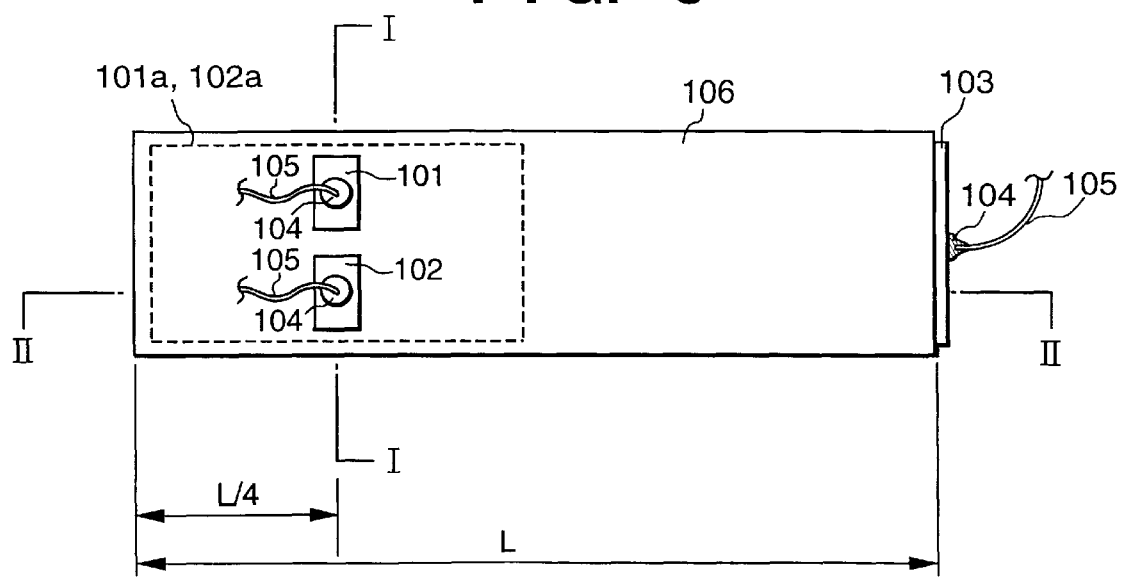
FIG. 3 is a plan view of the piezoelectric device in FIG. 1.
Figure 4:
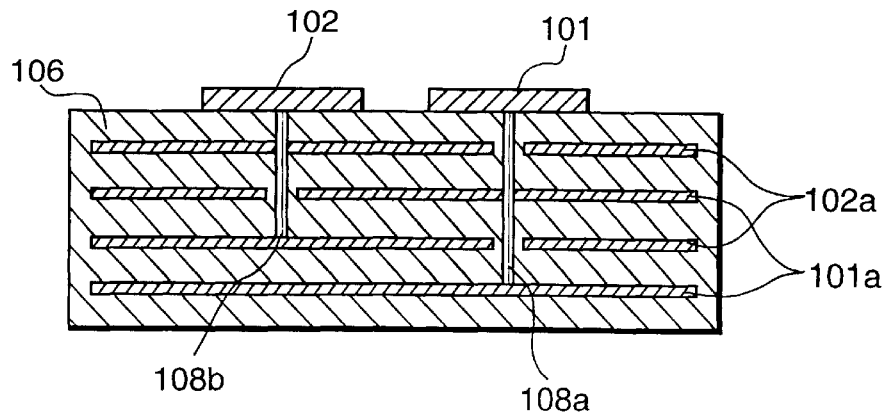
FIG. 4 is a sectional view taken along a line I—I of the piezoelectric device in FIG. 3.
Figure 5:
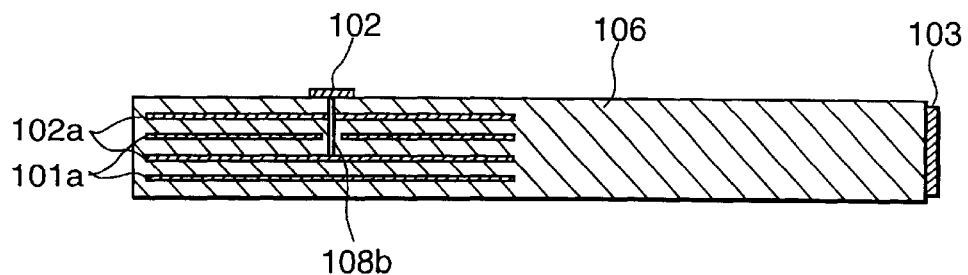
FIG. 5 is a sectional view taken along a line II—II of the piezoelectric device in FIG. 3.
Figure 6:
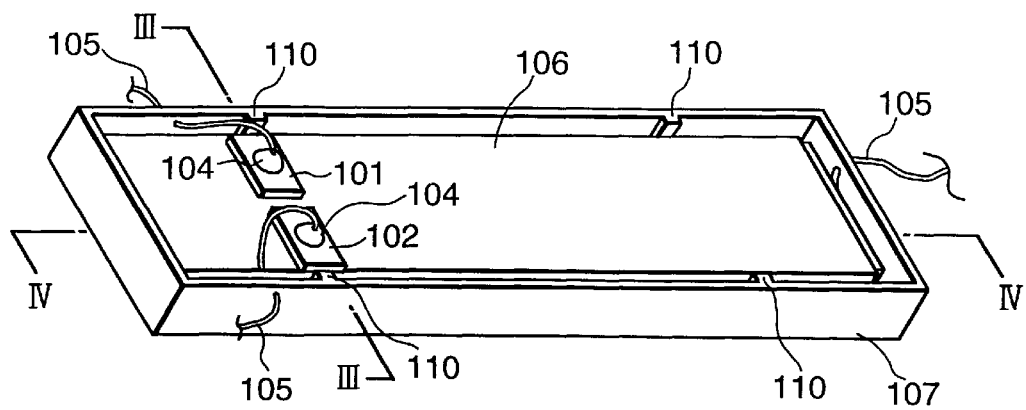
FIG. 6 is a perspective view showing a state in which the piezoelectric device having the multilayer structure previously proposed by the present applicant is housed in a general housing.
Figure 7:
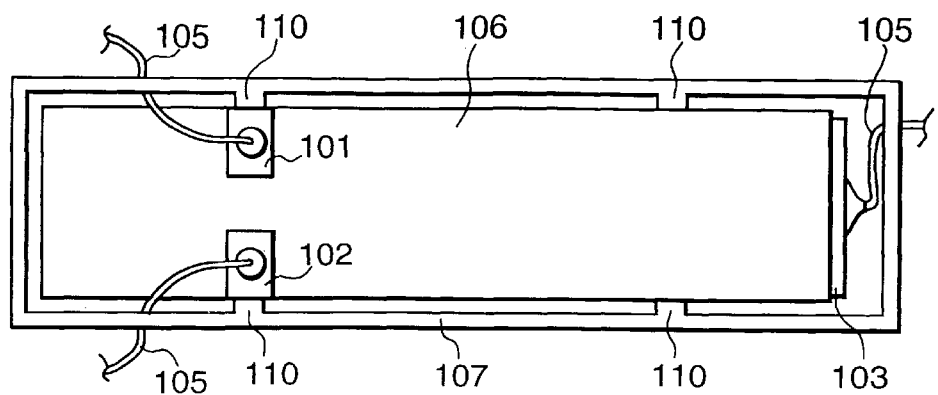
FIG. 7 is a plan view of the housing in FIG. 6.
Figure 8:
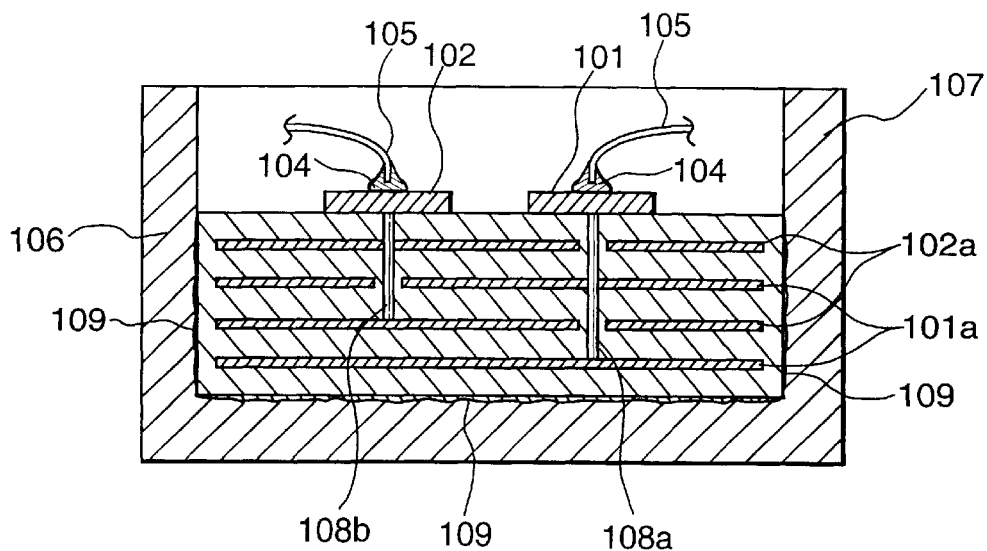
FIG. 8 is a sectional view taken along a line III—III of the housing in FIG. 6.
Figure 9:
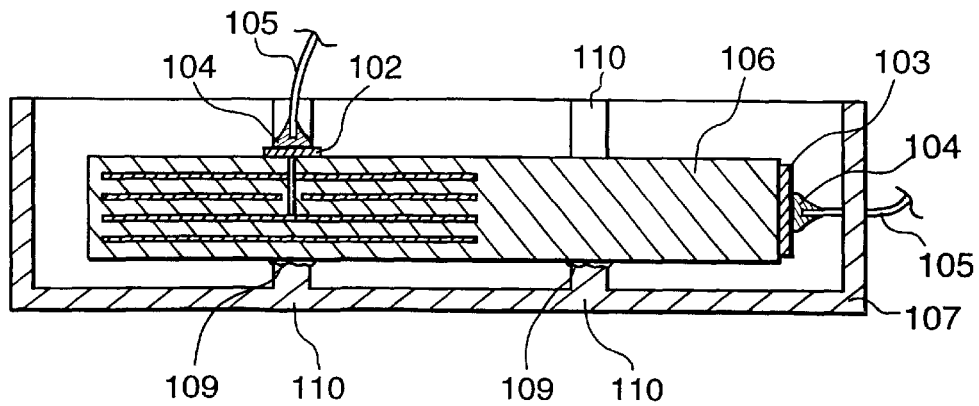
FIG. 9 is a sectional view taken along a line IV—IV of the housing in FIG. 6.
Figure 10:
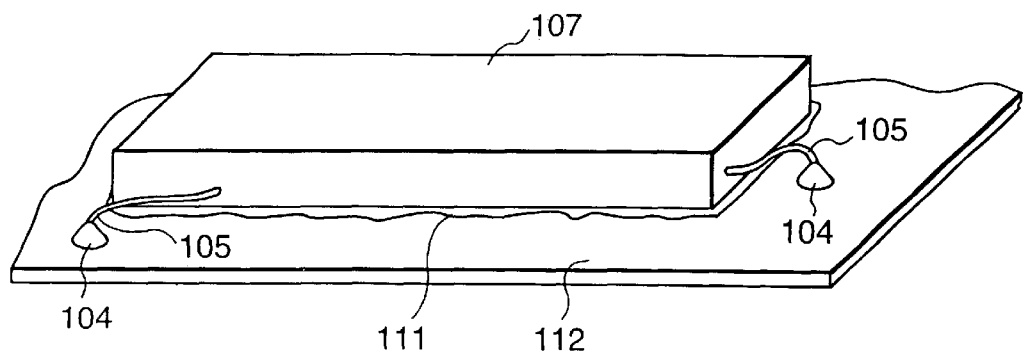
FIG. 10 is a perspective view showing a state in which the housing in FIG. 6 is mounted on a circuit board.
Figure 11:
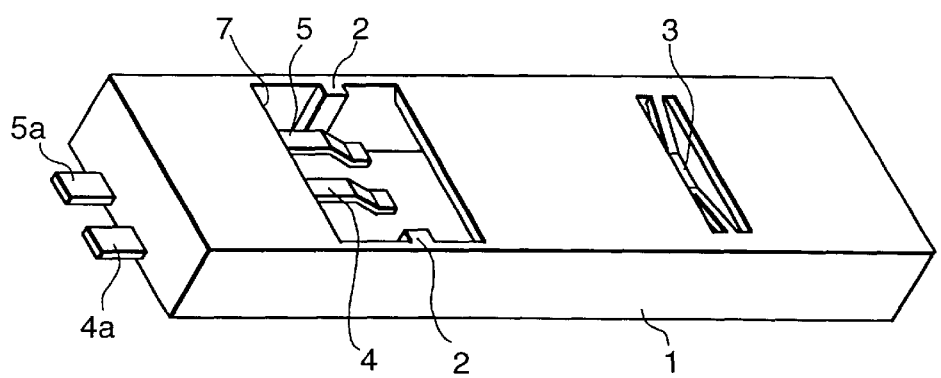
FIG. 11 is a perspective view showing a housing according to the first embodiment of the present invention.
Figure 12:
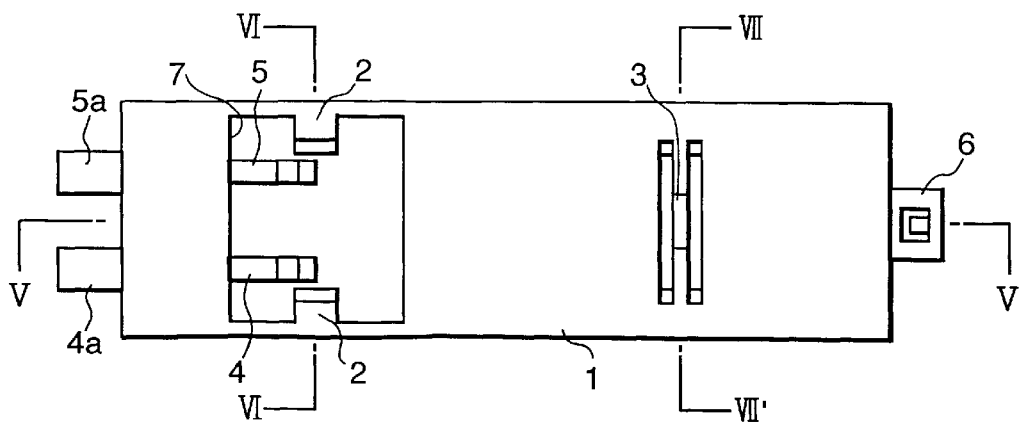
FIG. 12 is a plan view of the housing in FIG. 11.
Figure 13:
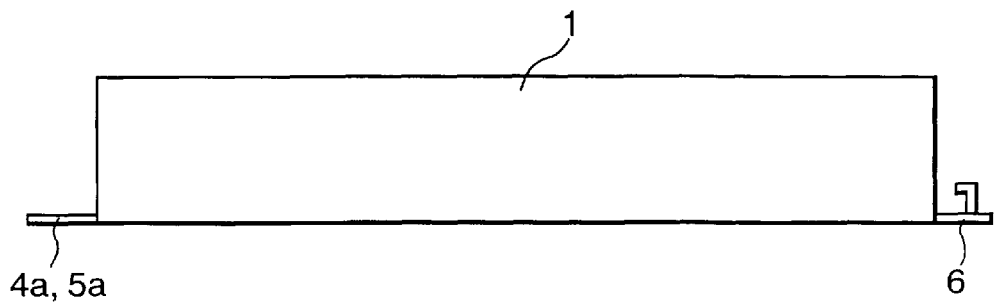
FIG. 13 is a front view of the housing in FIG. 11.
Figure 14:
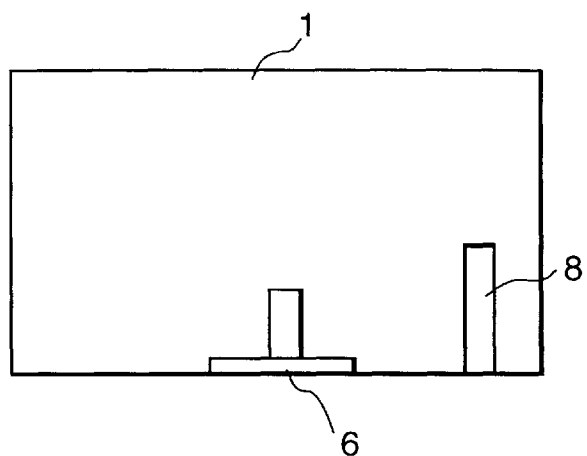
FIG. 14 is a right side view of the housing in FIG. 11.

FIG. 11 is a perspective view showing a housing according to the first embodiment of the present invention. FIG. 12 is a plan view of the housing in FIG. 11. FIG. 13 is a front view of the housing in FIG. 11. FIG. 14 is a right side view of the housing in FIG. 11.

FIGS. 11 to 13 show the state of a housing 1 before the piezoelectric device is housed therein. The housing 1 of this embodiment has a box-like shape having an opening in the bottom portion. The housing 1 is mainly constituted by a housing body using an insulating resin and a plurality of metal terminals. The piezoelectric device is inserted from the bottom surface side of the case. The housing 1 therefore has a volume larger than that of the piezoelectric device to be housed therein. The right and left half regions of the housing 1 will be respectively referred to as the second and first regions hereinafter.

Two metal mount terminals 4a and 5a as first mount terminals are formed on the end face of the first region of the housing 1 in the longitudinal direction. A metal mount terminal 6 as a second mount terminal is formed on the end face of the second region in the longitudinal direction. These mount terminals serve to mount the housing 1 on a circuit board and to function as the lead electrodes of the outer and output electrodes of the piezoelectric device to be housed in the case (to be described in detail later).

An opening 7 is formed in the upper portion of the first region of the housing 1. As shown in FIGS. 11 and 12, in the opening 7, elastic metal lead electrodes 4 and 5 in the form of leaf springs are integrally formed with the housing 1. Projections 2 as first projections are formed on the inside of the first region of the housing 1 at a position corresponding to a node of the vibrations of the piezoelectric device when it is housed in the case.

A projection 3 as a second projection made of the same material as that for the housing 1 and protruding inside the case is formed on the inner upper surface of the second region of the housing 1. Similar to the projections 2, this projection 3 is formed at a position corresponding to a node of the vibrations of the piezoelectric device. A slit 8 through which a lead wire extends is formed in a side surface of the second region. The slit 8 has a width larger than the diameter of the lead wire for connecting the secondary electrode of the piezoelectric device to the mount terminal 6 so as not to adversely affect the vibrations of the piezoelectric device.

Figure 15:
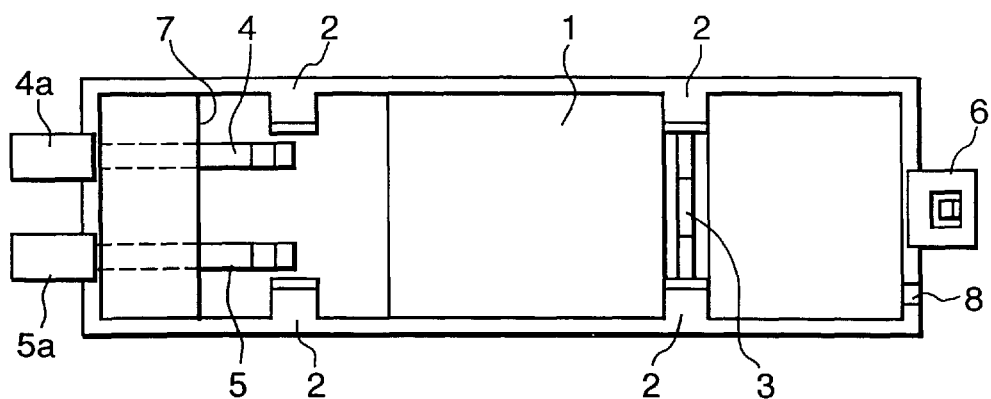
FIG. 15 is a bottom view of the housing in FIG. 11.
Figure 16:
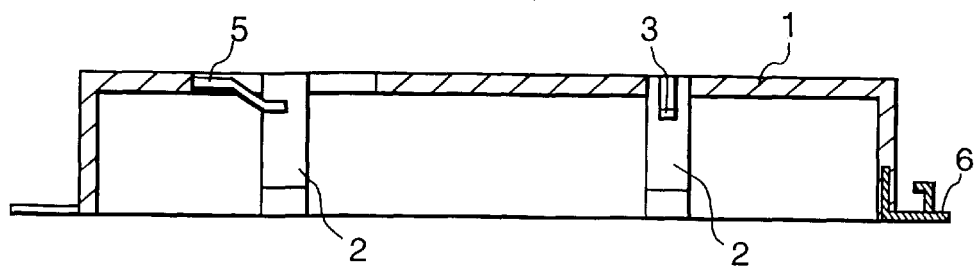
FIG. 16 is a sectional view taken along a line V—V in FIG. 12.
Figure 17:
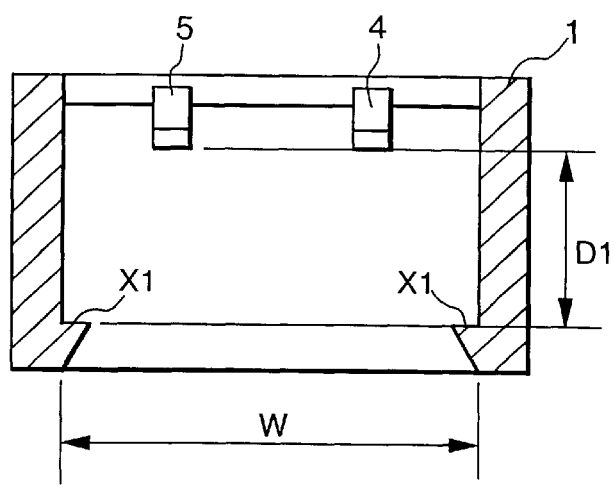
FIG. 17 is a sectional view taken along a line VI—VI in FIG. 12.
Figure 18:
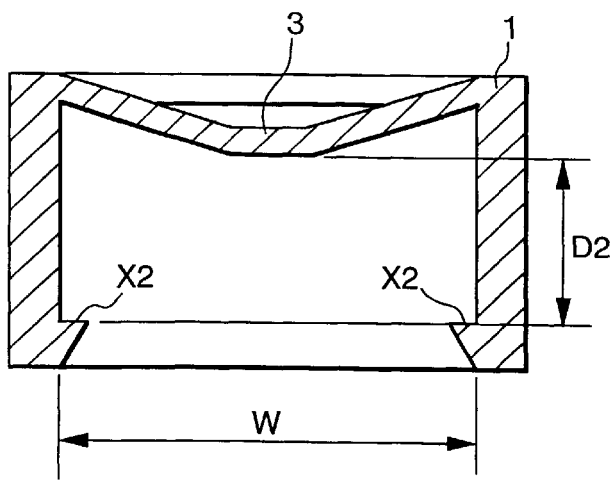
FIG. 18 is a sectional view taken along a line VII—VII in FIG. 12.

The internal structure of the housing 1 will be described next. FIG. 15 is a bottom view of the housing in FIG. 11. FIG. 16 is a sectional view taken along a line V—V in FIG. 12. FIG. 17 is a sectional view taken along a line VI—VI in FIG. 12. FIG. 18 is a sectional view taken along a line VII—VII in FIG. 12.

Each projection 2 has the shape shown in FIGS. 17 (first region) and 18 (second region). The pawl-like portion of each projection 2 on the bottom portion (lower side) of the housing 1 is tapered. In both the first and second regions, a distance W between the projections 2 on the two inner side surfaces of the housing 1 is equal to the width of the piezoelectric device to be housed.

As shown in FIG. 17, a distance D1 from the bottom surfaces of the lead electrodes 4 and 5 to the plane connecting right-angle portions X1 of the projections 2 on the two sides of the housing 1 is smaller than the thickness of the piezoelectric device.

As shown in FIG. 18, a distance D2 from the bottom surface of the projection 3 to the plane connecting right-angle portions X2 of the projections 2 on the two sides of the housing 1 is smaller than the thickness of the piezoelectric device. Note that the projection 3 is made of the same material as that for the housing 1, as described above. Since the projection 3 is molded into the shape shown in FIG. 18, it exhibits elasticity against an external force applied from the lower side in FIG. 18 to the bottom surface of the projection 3.

Figure 19:
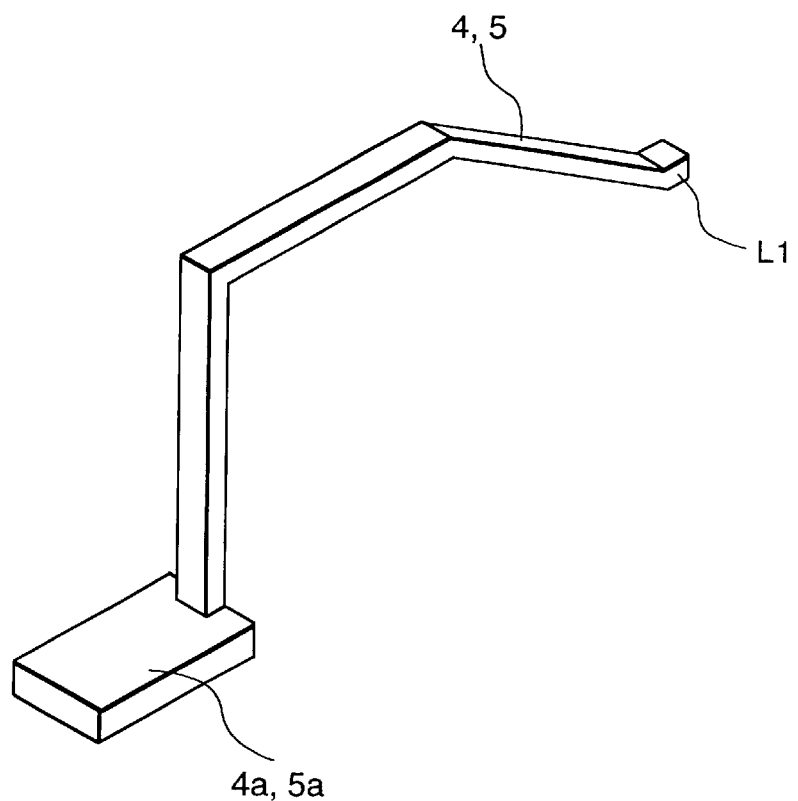
FIG. 19 is a perspective view showing the structure of a member obtained by integrally molding a mount terminal 4a (5a) and a lead electrode 4 (5)

The mount terminals 4a and 5a and the lead electrodes 4 and 5 formed in the first region are integrally molded, as indicated by the perspective view of FIG. 19. In the process of molding the housing 1, these members are embedded in the housing 1 in the state shown in FIGS. 15 and 16. In addition, a portion L1 in FIG. 19 is formed at a position corresponding to a node of the vibrations of the piezoelectric device.

Figure 20:
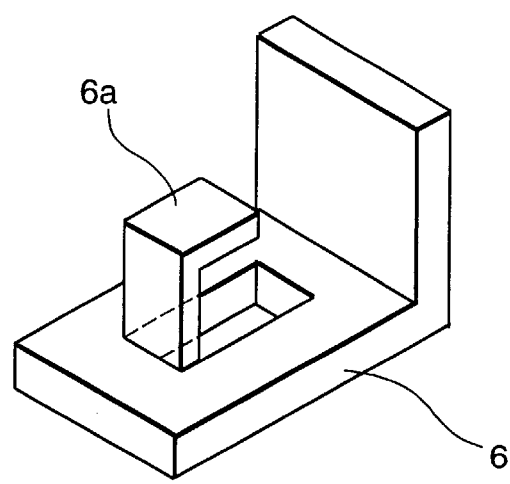
FIG. 20 is a perspective view showing the structure of a mount terminal 6.

The mount terminal 6 formed on the end face of the second region has the shape shown in the perspective view of FIG. 20. In the process of molding the housing 1, the mount terminal 6 is embedded in the housing 1 in the state shown in FIGS. 15 and 16. The mount terminal 6 has a projection 6a for holding the lead wire extending from the secondary electrode of the piezoelectric transformer.

A procedure for housing the piezoelectric device in the housing 1 will be described next. In this embodiment, the piezoelectric device 106 having the structure shown in FIGS. 1 to 5 is housed in the housing 1 in the state shown in FIG. 21, in which the lead wire 105 is soldered to the secondary electrode 103.

Figure 22:
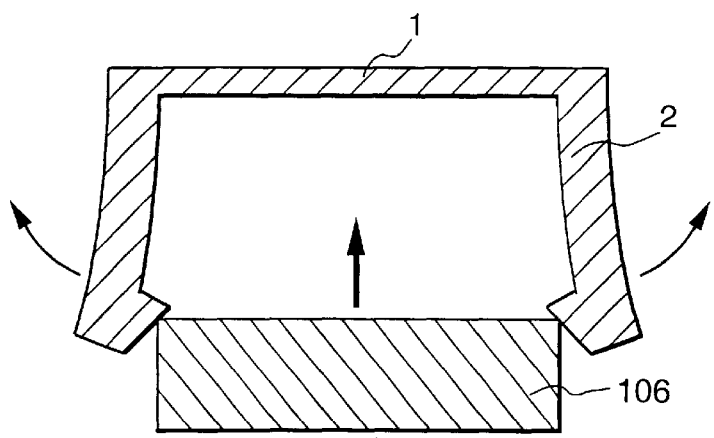
FIG. 22 is a view for explaining a state in which the piezoelectric device is inserted into the housing.

More specifically, the piezoelectric device 106 is pressed against the bottom portion of the housing 1. Then, the piezoelectric device 106 is inserted into the housing 1 toward the upper surface of the case until the device 106 stops. Since the pawl-like portions of the projections 2 of the housing 1 are tapered as described above, when the device is pressed against the bottom portion of the housing 1, the side surfaces of the housing 1 bend outward to allow the device to be easily inserted into the case, as shown in FIG. 22.

Figure 23:
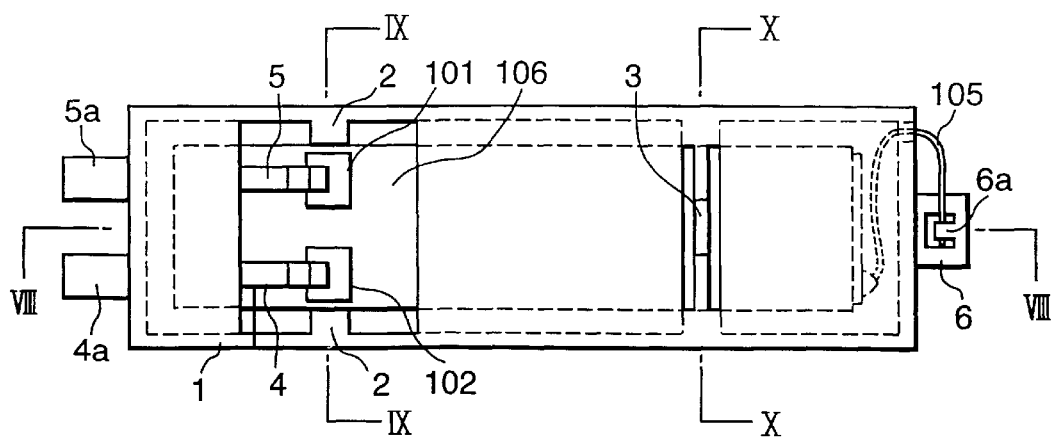
FIG. 23 is a plan view of the housing housing the piezoelectric device.
Figure 24:
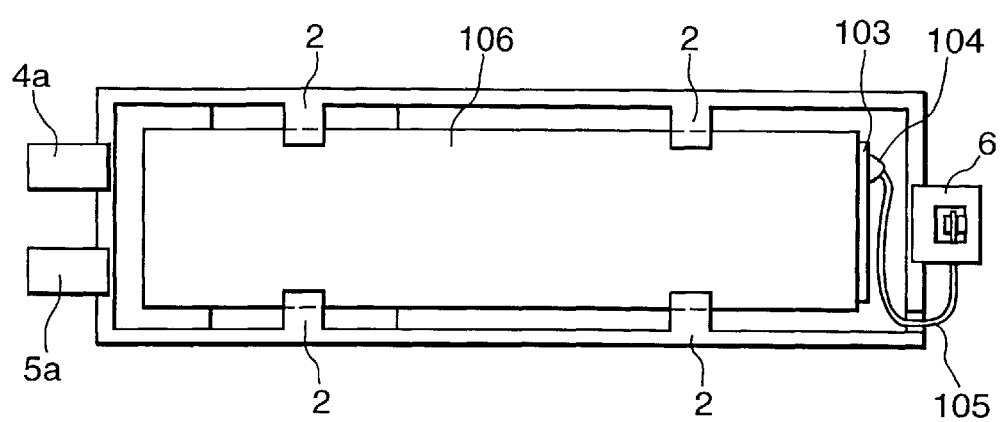
FIG. 24 is a bottom view of the housing in FIG. 23.
Figure 25:
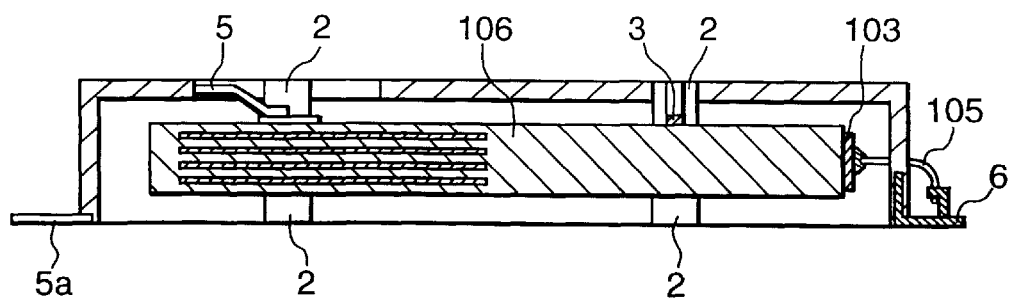
FIG. 25 is a sectional view taken along a line VIII—VIII in FIG. 23.
Figure 26:
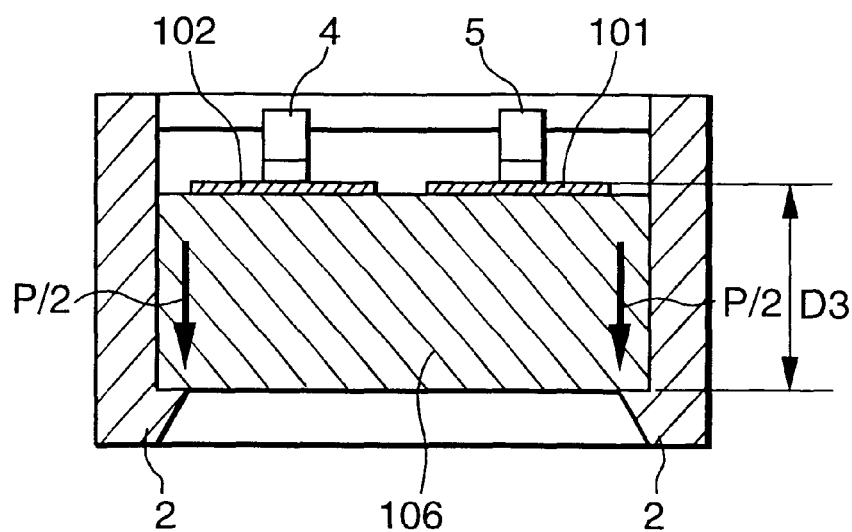
FIG. 26 is a sectional view taken along a line IX—IX in FIG. 23.
Figure 27:
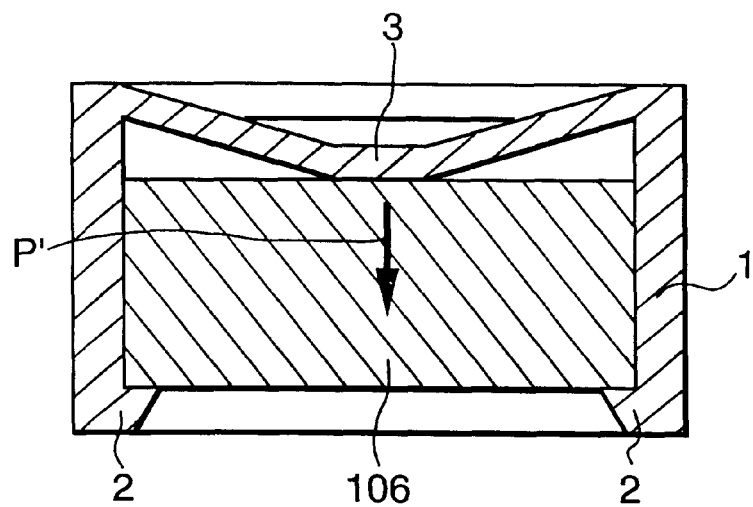
FIG. 27 is a sectional view taken along a line X—X in FIG. 23.

The housing 1 having the piezoelectric device 106 housed therein will be described next. FIG. 23 is a plan view of the housing 1 having the piezoelectric device housed therein. FIG. 24 is a bottom view of the housing in FIG. 23. FIG. 25 is a sectional view taken along a line VIII—VIII in FIG. 23. FIG. 26 is a sectional view taken along a line IX—IX in FIG. 23. FIG. 27 is a sectional view taken along a line X—X in FIG. 23.

As shown in FIGS. 24 and 25, the piezoelectric device 106 housed in the housing 1 is supported by the projections 2 of the housing 1 at portions corresponding to nodes of the vibrations of the device.

The distance D1 in FIG. 17 has changed to a distance D3 in FIG. 26 upon insertion of the piezoelectric device 106. The relationship between the distances D1 and D3 is defined as D3>D1. The difference between the distances D1 and D3 is produced when the lead electrodes 4 and 5 in the form of leaf springs deflect upward in FIG. 26. This deflection amount serves as a force P with which the lead electrodes 4 and 5 push the piezoelectric device 106 downward in FIG. 26. Since the piezoelectric device 106 is brought into contact with the right-angle portions X1 of the end portions of the projections 2 with the force P, the piezoelectric device 106 is fixed in the first region of the housing 1.

Note that the force P produced by the deflection amount is obtained from the material and shape of the lead electrodes 4 and 5 by the following equation:

$$P[kg]=bh^2\sigma/6L$$

where b [mm] is the width of each lead electrode, h [mm] is the thickness of each lead electrode, $\sigma$ [kg/mm$^2$] is the bending stress, and L [mm] is the length of each lead electrode from the fulcrum.

The present applicant made an experiment for checking the magnitude of the force P that was required to stably fix the piezoelectric device 106 in the housing 1 without causing disconnection upon application of an external shock or vibration. As a result, it was found that a force of about 4 [kg] was required to fix the piezoelectric device 106 of a weight of about 10 [g] in the housing 1. This force is produced by the lead electrodes 4 and 5 and the projection 3 and is used to fix the piezoelectric device 106.

While the piezoelectric device 106 is housed in the housing 1, the bottom surface portion of the projection 3 is in contact with the upper surface of the piezoelectric device 106, as shown in FIG. 27, and the projection 3 is deflecting upward in FIG. 27. For this reason, a force P' for pushing the piezoelectric device 106 downward acts on the bottom surface portion of the projection 3. Since the piezoelectric device 106 is brought into contact with right-angle portions X2 of the end portions of the projections 2 with the force P', the piezoelectric device 106 can be fixed in the second region of the housing 1.

While the piezoelectric device 106 is housed in the housing 1, the lead electrodes 4 and 5 are in contact with the outer electrodes 101 and 102 as the primary electrodes of the piezoelectric transformer. When, therefore, an input voltage is applied to the mount terminals 4a and 5a, a voltage can be applied to the primary electrodes of the piezoelectric device 106.

The lead wire 105 soldered to the outer electrode 103 of the piezoelectric device 106 extends outside the housing 1 through the slit 8 in FIG. 14 and is connected to the mount terminal 6. This lead wire 105 is soldered to the mount terminal 6. In this embodiment, the projection 6a is formed on the mount terminal 6 as shown in FIG. 20 to facilitate soldering.

The housing 1 in the state shown in FIGS. 23 to 25 is mounted on the circuit board by soldering the mount terminals 4a, 5a, and 6 to patterns formed on the circuit board.

Note that the formation of the opening 7 described in FIGS. 11 and 12 may be omitted to decrease the number of steps of designing a mold for the housing 1 and the manufacturing cost. Obviously, however, the opening 7 is preferably formed to facilitate a check on the connection state between the lead electrodes and the outer electrodes of the piezoelectric device 106 while the piezoelectric device 106 is housed in the housing 1 and to allow easy connection between the lead electrodes and the outer electrodes of the piezoelectric device 106 with a conductive adhesive or by soldering, as needed, through the opening 7 so as to improve the reliability of the piezoelectric transformer.

When the opening 7 is to be formed in the housing 1, part or all of the opening 7 is preferably covered with an insulating sheet in consideration of safety after the piezoelectric device 106 is housed in the housing 1 and its stored state is checked.

<Effects of First Embodiment>

As described above, according to the housing for the piezoelectric transfer device according to this embodiment, the piezoelectric device 106 can be easily housed in the housing 1 by only pushing the device into the case from the bottom portion side of the case. More specifically, (1) In the first region, the piezoelectric device 106 is brought into contact with the pawl-like portions of the projections 2 on the bottom portion of the housing 1 and is fixed thereto with the force P produced upon deflection of the elastic lead electrodes 4 and 5. This allows the piezoelectric device 106 to be fixed in the housing 1 without using any adhesive.

(2) In the second region, the piezoelectric device 106 is brought into contact with the pawl-like portions of the projections 2 on the bottom portion of the housing 1 and is fixed thereto with the force P' produced upon deflection of the projection 3 made of the same material as that for the housing 1. This allows the piezoelectric device 106 to be fixed in the housing 1 without using any adhesive.

(3) The lead electrode 4 (5) and the mount terminal 4a (5a) are integrally formed by using an elastic metal material, and the lead electrodes are brought into contact with the outer electrodes 101 and 102 of the piezoelectric device 106, thereby omitting the step of soldering the primary lead wires of the piezoelectric device 106.

(4) The housing 1 is designed such that the housing 1 housing the piezoelectric device 106 can be mounted on the circuit board by connecting the mount terminals 4a, 5a, and 6, i.e., the three portions to the circuit patterns on the circuit board. This can omit the step of bonding the housing 1 on the circuit board with an adhesive.

(5) The formation of the opening 7 in the upper portion of the housing 1 facilities a check on the connection state between the lead electrodes and the outer electrodes of the piezoelectric device 106 while the piezoelectric device 106 is housed in the housing 1. In addition, with the opening 7, the lead electrodes can be easily connected to the outer electrodes of the piezoelectric device 106 with a conductive adhesive or by soldering, as needed.

Second Embodiment

The second embodiment of the present invention will be described with reference to FIGS. 28 to 33.

Figure 28:
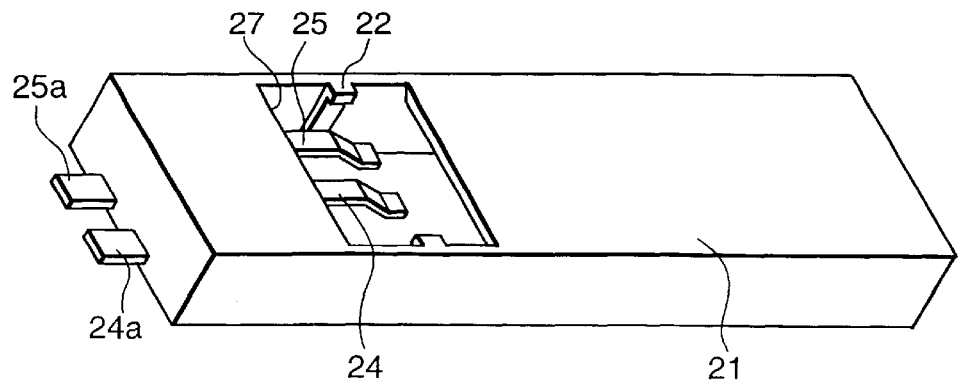
FIG. 28 is a perspective view showing a housing according to the second embodiment of the present invention.
Figure 29:
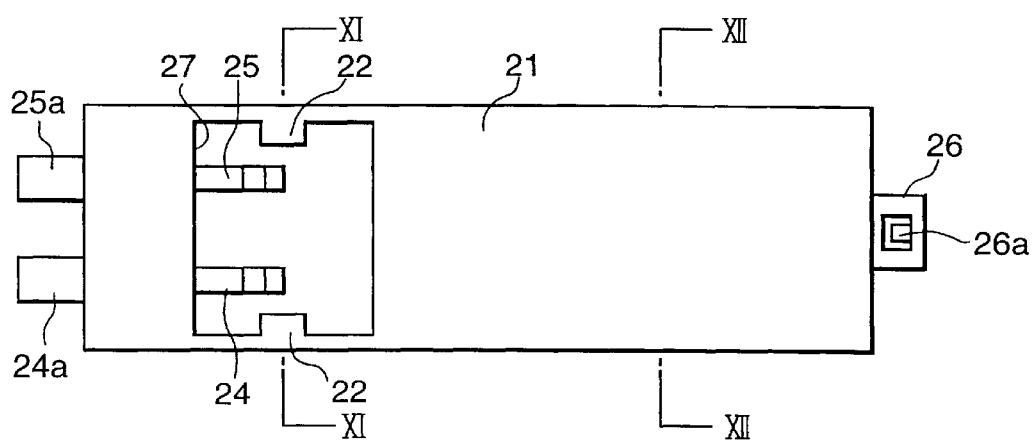
FIG. 29 is a plan view of the housing in FIG. 28.

The outer shape of a housing 21 will be described first. FIG. 28 is a perspective view showing the housing according to the second embodiment of the present invention. FIG. 29 is a plan view of the housing in FIG. 28.

In the housing 21 shown in FIGS. 28 and 29, lead electrodes 24 and 25, mount terminals 24a and 25a, and amount terminal 26 respectively have the same structures and functions as those of the lead electrodes 4 and 5, the mount terminals 4a and 5a, and the mount terminal 6 in the first embodiment described above, and hence a description thereof will be omitted.

Figure 30:
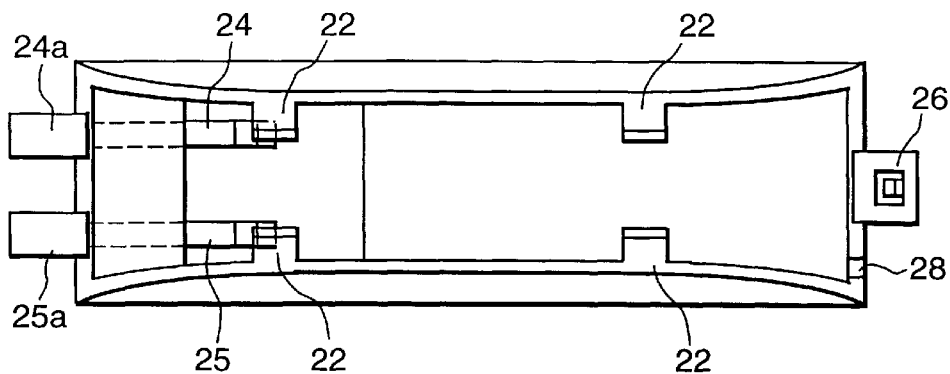
FIG. 30 is a bottom view of the housing in FIG. 28.
Figure 31:
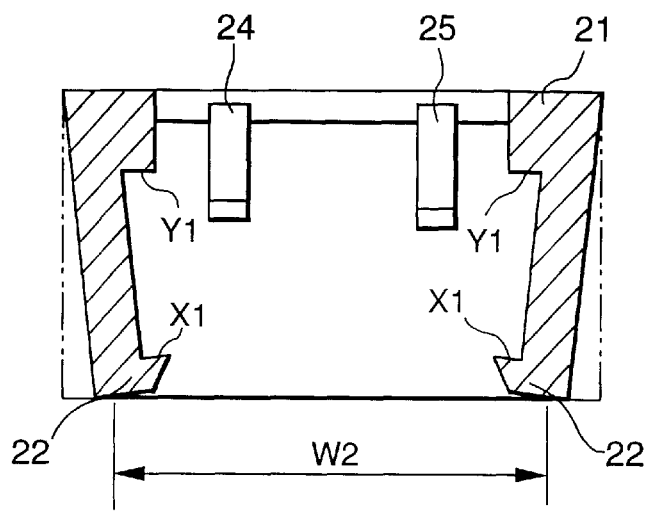
FIG. 31 is a sectional view taken along a line XI—XI in FIG. 29.
Figure 32:
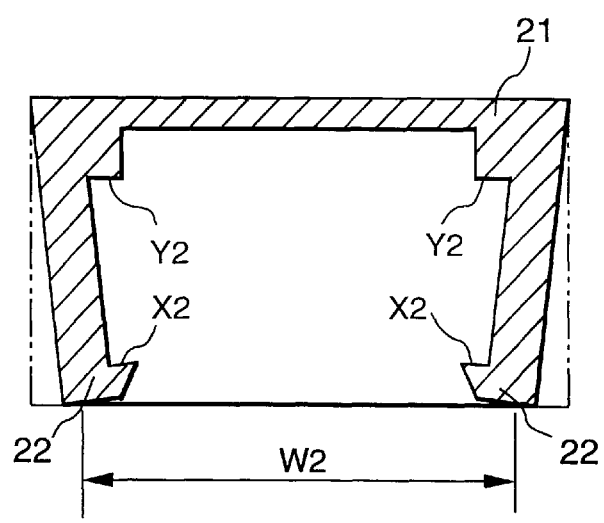
FIG. 32 is a sectional view taken along a line XII—XII in FIG. 30.

The structural characteristics of the housing 21 according to this embodiment will be described next. FIG. 30 is a bottom view of the housing in FIG. 28. FIG. 31 is a sectional view taken along a line XI—XI in FIG. 29. FIG. 32 is a sectional view taken along a line XII—XII in FIG. 30.

As shown in FIGS. 30 to 32, in this embodiment, the width of the housing 21 on the bottom portion side is smaller than the width of the housing 21 on the upper side.

In addition, in this embodiment, projections 22 as first projections are used in both the first region (FIG. 31) and the second region (FIG. 32) so as to fix a piezoelectric device 106 in the housing 21.

As in the first embodiment, the projections 22 have pawl-like portions formed on the bottom portion side of the housing 21, the pawl-like portions have right-angle portions X1 and X2 with which the piezoelectric device 106 comes into contact. The pawl-like portions are also tapered.

The projections 22 on the upper surface side of the housing 21 also have right-angle portions Y1 and Y2 with which the piezoelectric device 106 is brought into contact. The housing 21 therefore has no projection 3 in the first embodiment.

In this embodiment, with this structure of the housing 21, after the piezoelectric device 106 is inserted into the housing 21, the piezoelectric device 106 is fixed by using a restoring force Pr that tries to restore the housing 21 to the shape shown in FIGS. 30 to 32. Unlike this embodiment, the first embodiment uses the force P produced upon deflection of the lead electrodes and the force P' produced upon deflection of the resin projection.

Figure 33:
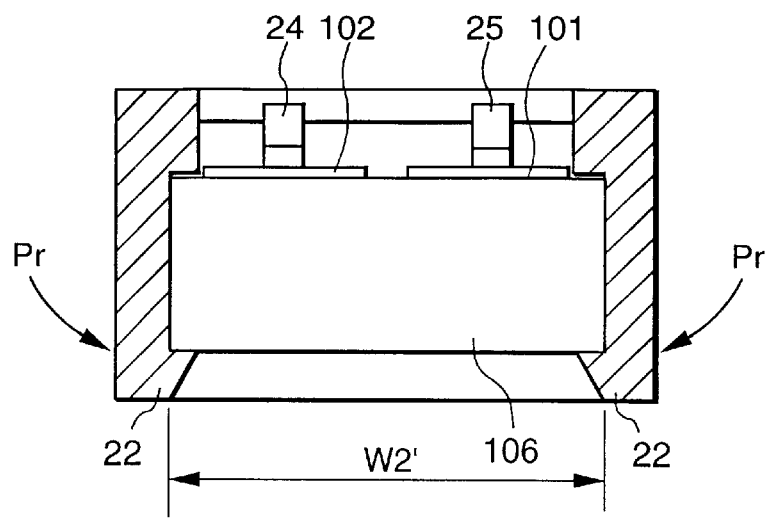
FIG. 33 is a sectional view showing a state in which the piezoelectric device 106 is fixed in the housing 21.

FIG. 33 is a sectional view taken along a line XI—XI in FIG. 29, showing a state in which the piezoelectric device 106 is fixed in the housing 21. When the piezoelectric device 106 is inserted into the housing 21, a width W2 of the housing 21 on the bottom side shown in FIGS. 31 and 32 increases to a width W2', as shown in FIG. 33. As a result, the shape of the bottom portion of the housing 21 becomes almost the same as the shape (rectangle) of the upper surface portion of the case. In this state, since the housing 21 itself is molded into the shape shown in FIGS. 30 to 32, the side surfaces of the housing 21 in the longitudinal direction are deflecting outside the case. The projections 22 can clamp the piezoelectric device 106 in the directions of the arrows in FIG. 33 with the resorting force Pr that tries to restore the side surface portions to the original shape. This allows the piezoelectric device 106 to be fixed in the housing 21 with the projections 22 and the right-angle portions X1, X2, Y1, and Y2 at the portions corresponding to nodes of the vibrations of the piezoelectric device 106.

In this embodiment as well, an opening 27 can be omitted. However, the opening 27 is preferably formed for the reasons described in the first embodiment.

<Effects of Second Embodiment>

(1) Since the restoring force Pr that tries to restore the entire side surface portions of the housing 21 to the original shape is used to fix the piezoelectric device 106, the device can be fixed with a larger force than that in the first embodiment.

(2) Since the restoring force Pr is used to fix the piezoelectric device 106, the formation of the projection 3 in the first embodiment can be omitted. This reduces the number of steps of designing a mold for the housing 1 and the manufacturing cost.

(3) Since the resorting force Pr is used to fix the piezoelectric device 106, members having less elasticity than the lead electrodes 4 and 5 in the first embodiment can be used for the lead electrodes 24 and 25. This reduces the unit cost of members constituting a piezoelectric transformer.

Since the projections 22 are tapered, the piezoelectric device 106 can be easily housed in the housing 21. In addition, the housing 21 can be mounted on the circuit board with the three mount terminals. These effects are the same as those of the first embodiment, in addition to the effects obtained by forming the opening 27.

<Modification of Embodiment>

Figure 21:
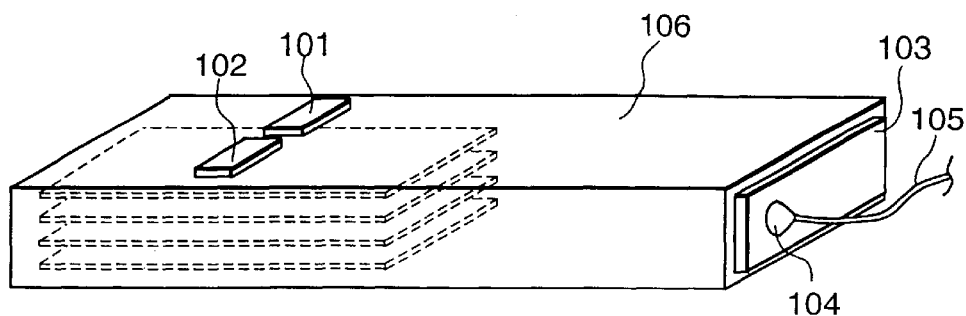
FIG. 21 is a perspective view showing the state of the piezoelectric device before it is housed in the housing.

In each embodiment, the piezoelectric device having the structure shown in FIG. 21 is used as an example of a piezoelectric device to be housed. However, the structure in which the outer electrode 103 is formed on the end portion of the piezoelectric device 106 and the lead wire 105 is connected to the outer electrode 103 is not an optimal structure from the point of view that the mechanical vibrations of the piezoelectric device itself should not be suppressed as much as possible, and the number of manufacturing steps for mass production should be minimized. For example, therefore, the piezoelectric device having the structure shown in FIG. 34, which is based on the structure of the piezoelectric device disclosed in Japanese Patent Application No. 9-148232 previously filed by the present applicant, may be used. Note that Japanese Patent Application No. 9-148232 was not laid open to public inspection when the present application was filed. In addition, the present applicant filed International Application No. PCT/JP97/02383 (and Taiwanese Patent Application No. 86109729) including the present application as a declaration of priority.

Figure 34:
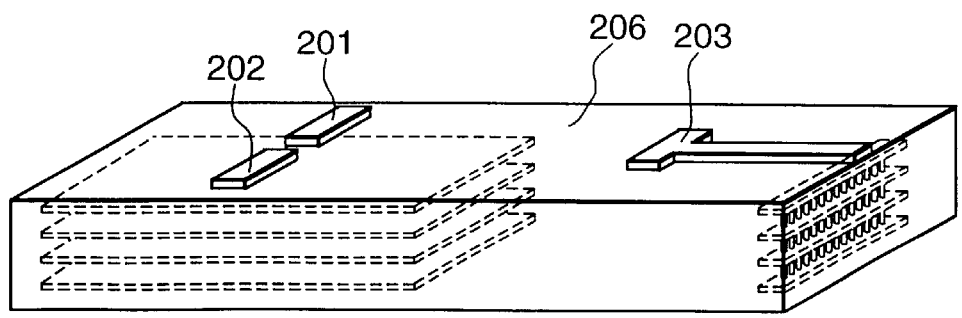
FIG. 34 is a perspective view showing a modification of part of the structure of the piezoelectric device previously proposed by the present applicant.

FIG. 34 is a perspective view showing a modification of part of the structure of the piezoelectric device previously proposed by the present applicant.

Referring to FIG. 34, the left inner region of a piezoelectric device 206 has the same structure as that of the piezoelectric device 106 described above. A mesh-like secondary output electrode is formed in an inner region near the right end portion of the piezoelectric device 206, and an outer electrode 203 as a lead electrode for the output electrode is formed on the surface of the secondary side of the device at a portion corresponding to a node of the vibrations of the piezoelectric device 206. As shown in FIG. 34, the outer electrode 203 and the mesh-like secondary output electrode are connected to each other through the lead electrode formed on the surface of the device. Therefore, only primary input electrodes 201 and 202 respectively connected to the two inner electrode groups, the outer electrode 203, and the lead electrode that connects the outer electrode 203 to the mesh-like secondary output electrode are exposed on the same upper surface of the piezoelectric device 206.

Consider a case in which the piezoelectric device 206 having this structure is housed in the housing of each embodiment described above.

In this case, the housing in which the piezoelectric device 206 is to be fixed may have the following structure based on the structure of the housing 1 or 21 described above. More specifically, the first region of the housing, which is to be connected to the input electrodes 201 and 202, may have the same structure as the first region of the housing 1 or 21. Obviously, the second region of the housing, which is to be connected to the outer electrode 203 on the secondary side, may have one member (see FIG. 19) obtained by integrally forming a mount terminal and a lead electrode in conformity with the structure of the second region of the housing 1 or 21. The concept of the present invention can therefore be easily applied to a case in which a piezoelectric device having a structure similar to that of the piezoelectric device 206 is used. In addition, the lead wires on the secondary side of the piezoelectric device can be omitted. This can reduce the number of steps for mass production. In addition, the proper operation of the device as a piezoelectric transformer can be ensured.

As has been described above, according to each embodiment described above, there is provided a housing that facilitates the housing process for a piezoelectric transformer device and can be easily mounted on a circuit board. This can reduce the mass production cost of piezoelectric transformers.

As many apparently widely different embodiments of the present invention can be made without departing from the spirit and scope thereof, it is to be understood that the invention is not limited to the specific embodiments thereof except as defined in the claims.

What is claimed is:

1. A housing for a piezoelectric transformer device made of a resin and adapted to house the piezoelectric transformer device (106) having primary outer electrodes (101, 102) formed in one plane, characterized in that a bottom portion of said housing (1) has an opening in which said piezoelectric transformer device is inserted;

an upper portion of said housing has lead electrodes (4, 5) to apply voltage to said outer electrodes, said lead electrodes being formed by using elastic members that produce a restoring force when said outer electrodes are brought into contact with said lead electrodes; and portions of two inner side surfaces of said housing at positions corresponding to nodes of vibrations of said piezoelectric transformer device when said piezoelectric transformer device is housed, have first projections (2) having pawl-like portions (X1, X2) on a bottom portion side of said housing, wherein said piezoelectric transformer device is supported in said housing by using said lead electrodes, said first projections, and said pawl-like portions of said first projections.

2. The housing case according to claim 1, characterized in that a primary side of said piezoelectric transformer device is brought into contact with said pawl-like portions with the restoring force produced by said lead electrodes.

3. The housing according to claim 1, characterized in that a portion of an inner upper surface of said housing at a position corresponding to a node of vibrations of the secondary side of said piezoelectric transformer device when said piezoelectric transformer device is housed further has a second projection (3), and the secondary side of said piezoelectric transformer device is supported in said housing by using said first projections, said pawl-like portions of said first projections, and said second projection.

4. The housing according to claim 3, characterized in that said second projection is integrally formed with said housing to produce a restoring force when said piezoelectric transformer device is brought into contact with said second projection, and the secondary side of said piezoelectric transfer device is brought into contact with said pawl-like portion by using the restoring force.

5. The housing according to claim 1, characterized in that said pawl-like portions are tapered to facilitate insertion of said piezoelectric transformer device into said housing.

6. A housing for a piezoelectric transformer device made of a resin and adapted to house the piezoelectric transformer device (106) having primary outer electrodes (101, 102) formed in one plane, characterized in that a bottom portion of said housing (21) has an opening in which said piezoelectric transformer device is inserted;

an upper portion of said housing has lead electrodes (24, 25) to apply voltage to said outer electrodes, said lead electrodes being formed by using elastic members that produce a restoring force when said outer electrodes are brought into contact with said lead electrodes; and portions of two inner side surfaces of said housing at positions corresponding to nodes of vibrations of said piezoelectric transformer device when said piezoelectric transformer device is housed have projections (22, X1, X2, Y1, Y2) formed in conformity with a shape of side surfaces of said piezoelectric transformer device in a widthwise direction, wherein said piezoelectric transformer device is supported in said housing by using said projections.

7. The housing according to claim 6, characterized in that portions of said projections which are located on a bottom side of said housing are tapered to facilitate insertion of said piezoelectric transformer device into said housing.

8. The housing according to claim 6, characterized in that said housing is molded with a flexible resin, and said piezoelectric transformer device is clamped through said projections with restoring forces produced on said two side surfaces of said housing when said piezoelectric transformer device is housed in said housing.

9. The housing according to claim 1, characterized in that said lead electrodes and mount terminals (4a, 5a, 24a, 25a) used to mount said housing on a circuit board are integrally formed.

10. The housing according to claim 1, characterized in that one end portion of said lead electrode comes into contact with said outer electrode at a position corresponding to a node of vibrations of the primary side of said piezoelectric transformer device.

11. The housing according to claim 1, characterized by further comprising a lead wire (105) connected to a secondary outer electrode (103) of said piezoelectric transformer device, and a mount terminal (6, 26) used to mount said housing on a circuit board.

12. The housing according to claim 11, characterized in that said mount terminal includes a projection (6a, 26a) for holding the lead wire.

13. The housing according to claim 1, characterized in that an opening (7, 27) is formed above said lead electrode of said housing.

14. The housing according to claim 13, characterized in that part or all of the opening is covered with an insulating sheet.

15. The housing according to claim 6, characterized in that said lead electrodes and mount terminal (4a, 5a, 24a, 25a) used to mount said housing on a circuit board are integrally formed.

16. The housing according to claim 6, characterized in that one end portion of said lead electrode comes into contact with said outer electrode at a position corresponding to a node of vibrations of the primary side of said piezoelectric transformer device.

17. The housing according to claim 6, characterized by further comprising a lead wire (105) connected to a secondary outer electrode (103) of said piezoelectric transformer device, and a mount terminal (6, 26) used to mount said housing on a circuit board.

18. The housing according to claim 17, characterized in that said mount terminal includes a projection (6a, 26a) for holding the lead wire.

19. The housing according to claim 6, characterized in that an opening (7, 27) is formed above said lead electrode of said housing.

20. The housing according to claim 19, characterized in that part or all of the opening is covered with an insulating sheet.

* * * * *